United States Patent
Kraemer

(10) Patent No.: US 8,427,333 B2
(45) Date of Patent: Apr. 23, 2013

(54) SYSTEM AND METHOD FOR DETECTING LIGHTNING

(75) Inventor: Sebastian Gerhard Maxim Kraemer, Munich (DE)

(73) Assignee: General Electric Company, Niskayuna, NY (US)

( * ) Notice: Subject to any disclaimer, the term of this patent is extended or adjusted under 35 U.S.C. 154(b) by 847 days.

(21) Appl. No.: 12/493,283

(22) Filed: Jun. 29, 2009

(65) Prior Publication Data

US 2010/0328084 A1 Dec. 30, 2010

(51) Int. Cl.
*G08B 21/10* (2006.01)
*G01W 1/00* (2006.01)

(52) U.S. Cl.
USPC .......... 340/659; 340/601; 73/170.24; 324/72; 702/4; 702/66

(58) Field of Classification Search ............ 60/398, 60/416; 73/170.24; 174/2–3; 290/44; 324/72; 340/10.1, 601, 657, 659–664; 416/58, 60–61, 416/90 A; 434/398; 702/4, 64–66
See application file for complete search history.

(56) References Cited

U.S. PATENT DOCUMENTS

| | | | | |
|---|---|---|---|---|
| 3,814,082 A * | 6/1974 | Taylor | | 600/483 |
| 5,140,523 A * | 8/1992 | Frankel et al. | | 702/4 |
| 5,771,020 A * | 6/1998 | Markson et al. | | 342/460 |
| 6,741,069 B1 | 5/2004 | Klemar et al. | | |
| 7,379,169 B1 | 5/2008 | Kraemer et al. | | |
| 7,806,657 B2 * | 10/2010 | Schram et al. | | 416/61 |
| 8,073,622 B2 * | 12/2011 | Said et al. | | 702/4 |
| 8,248,226 B2 * | 8/2012 | Friar | | 340/506 |
| 2004/0130842 A1 | 7/2004 | Johansen et al. | | |
| 2004/0254731 A1 | 12/2004 | Murphy | | |
| 2004/0257216 A1 * | 12/2004 | Parker et al. | | 340/507 |
| 2005/0197776 A1 * | 9/2005 | Makela et al. | | 702/4 |
| 2006/0126252 A1 * | 6/2006 | Mortensen | | 361/118 |
| 2006/0133933 A1 * | 6/2006 | Wobben | | 416/61 |

(Continued)

FOREIGN PATENT DOCUMENTS

EP 1754887 A1 2/2007

OTHER PUBLICATIONS

Brian McNiff; "Wind Turbine Lightning Protection Project—1999-2001"; Subcontactor Report; May 2002; NREL/SR-500-31115 Available from Internet:<http://www.nrel.gov/docs/fy02osti/31115.pdf>; 100 Pages.

(Continued)

*Primary Examiner* — Benjamin C Lee
*Assistant Examiner* — Stephen Burgdorf
(74) *Attorney, Agent, or Firm* — Ann M. Agosti

(57) ABSTRACT

A lightning detection system is presented. The lightning detection system includes a plurality of sensing devices configured to generate sensor signals representative of one or more working state parameters of an object. The lightning detection system further includes a lightning signal processing subsystem configured to combine the sensor signals representative of the one or more working state parameters received from the plurality of sensing devices to generate a composite signal, extract noise signals from the composite signal, and compare the extracted noise signals with one or more lightning signal profiles to determine existence of lightning noise signals in the extracted noise signals, wherein the lightning noise signals are induced in the sensor signals in response to a lightning strike on the object.

21 Claims, 5 Drawing Sheets

U.S. PATENT DOCUMENTS

| | | | |
|---|---|---|---|
| 2006/0192668 A1* | 8/2006 | Friar | 340/521 |
| 2007/0159346 A1* | 7/2007 | Wesselink | 340/679 |
| 2008/0017788 A1* | 1/2008 | Kraemer | 250/227.11 |
| 2008/0122424 A1* | 5/2008 | Zhang et al. | 324/72 |
| 2008/0206052 A1* | 8/2008 | Volkmer | 416/61 |
| 2009/0179628 A1* | 7/2009 | Jantunen et al. | 324/72 |
| 2009/0237272 A1* | 9/2009 | Georgeson et al. | 340/945 |
| 2010/0143117 A1* | 6/2010 | Xiong | 416/1 |

OTHER PUBLICATIONS

Sebastian G. M. Kramer; Fernando Puente Leon & Benoit Appert; "Fiber Optic Sensor Network for Lightning Impact Localization and Classification in Wind Turbines"; 2006 IEEE International Conference on Multisensor Fusion and Integration for Intelligent Systems; Sep. 3-6, 2006, Heidelberg, Germany; MoC02.1; pp. 173-178.

Sebastian G.M. Krämer, Fernando Puente León, Bastian Lewke, Yarú Méndez Hernández; "Lightning Impact Classification on Wind Turbine Blades using a Fiber Optic Measurement System"; Available from Internet:< http://www.hsa.ei.tum.de/Publikationen/2007/007_2007_Windpower_lightning_classification.pdf >; 7Pages.

Sebastian G.M. Kramer, Fusion of a FBG-based Health Monitoring System for Wind Turbines with a Fiber-Optic Lightning Detection System, Proceedings of SPIE—The International Society for Optical Engineering, vol. 7004, 2008, pp. 700400-1-700400-4, Germany, XP-002607407.

European Search Report and Written Opinion issued in connection with application EP 10166696.4, Dec. 1, 2010.

* cited by examiner

SYSTEM AND METHOD FOR DETECTING LIGHTNING

BACKGROUND

The invention relates generally to lightning detection systems, and more particularly, to lightning detection systems for wind turbines.

Lightning is a random phenomenon in nature. As will be appreciated, lightning parameters vary depending on geographical conditions and the nature of lightning in terms of intensity and impact on an object. Wind turbines, in particular, are generally subjected to a high risk of lightning strikes as they are preferentially placed at high and windy locations in order to achieve high productivity.

Currently, there exist several lightning detection systems for use with wind turbines. These techniques may broadly be classified into two categories. In a first category of lightning detection systems the detection system includes magnetic cards positioned in various parts of a wind turbine blade to detect lightning current passing through. After a lightning impact, the magnetic cards are read out manually by a card reader unit to measure a peak value of current. However, the system is unable to detect the number of lightning sequences striking a wind turbine between periods of two magnetic card readings.

Additionally, in a second category of lightning detection systems, the lightning detection systems include small antennas fixed on a body of a wind turbine tower. The antennas are used to detect lightning currents and magnetic fields that pass through the wind turbine tower. Signals from the antennas are transformed from an electrical signal to an optical signal and are communicated to a control box via an optical fiber. Further, an output of the control box is indicative of a lightning impact. Unfortunately, in most cases, the system has to be reset by an acknowledgement signal. Moreover, an affected blade cannot be automatically identified via use of these lightning detection systems.

Furthermore, conventional lightning detection systems, including the abovementioned two categories of lightning detection systems typically require installation of specialized sensors such as small antennas, magnetic cards, and the like for detection of a lightning strike. The installation of supplementary sensors thus results in additional cost for detection of the lightning strike. Moreover, conventional lightning detection systems are configured to register occurrence of lightning events. However, these conventional systems fail to register lightning event parameters or localization of impact. Therefore, a need exists for an improved lightning detection system that may address one or more of the problems set forth above.

BRIEF DESCRIPTION

Briefly in accordance with one aspect of the technique, a lightning detection system is presented. The lightning detection system includes a plurality of sensing devices configured to generate sensor signals representative of one or more working state parameters of an object. The lightning detection system further includes a lightning signal processing subsystem configured to combine the sensor signals representative of the one or more working state parameters received from the plurality of sensing devices to generate a composite signal, extract noise signals from the composite signal, and compare the extracted noise signals with one or more lightning signal profiles to determine the existence of lightning noise signals in the extracted noise signals.

In accordance with another aspect of the present technique, a lightning detection system is presented. The lightning detection system includes a plurality of sensing devices configured to generate sensor signals representative of one or more working state parameters of an object. The lightning detection system further includes a sensing subsystem including one or more sensing modules and configured to extract noise signals from the sensor signals representative of the one or more working state parameters of the object received from the plurality of sensing devices and compare the extracted noise signals with one or more lightning signal profiles to determine existence of lightning noise signals in the extracted noise signals. The lightning detection system also includes a lightning signal processing subsystem in operative communication with the sensing subsystem and configured to combine the extracted noise signals received from the sensing subsystem to generate a composite noise signal based on determination of lightning noise signals in at least one of the extracted noise signals, wherein the lightning noise signals are induced in the sensor signals in response to a lightning strike on the object.

In accordance with still another embodiment of the present technique, a lightning detection method is presented. The method includes combining one or more sensor signals representative of one or more working state parameters to generate a composite signal, wherein the one or more sensor signals are received from a plurality of sensing devices disposed on an object, extracting noise signals from the composite signal via use of a lightning signal processing subsystem, and comparing the extracted noise signals with one or more lightning signal profiles to determine existence of lightning noise signals in the extracted noise signals via use of the lightning signal processing subsystem, wherein a lightning strike on the object induces the lightning noise signals in the sensor signals representative of the one or more working state parameters.

In accordance with yet another embodiment of the present technique, a lightning detection method is presented. The method includes extracting noise signals from one or more sensor signals representative of one or more working state parameters of an object, wherein the one or more sensor signals are received from one or more sensors disposed on the object, comparing the extracted noise signals with one or more lightning signal profiles to determine existence of lightning noise signals in the extracted noise signals, and combining the extracted noise signals to generate a composite noise signal based on a determination of lightning noise signals in the extracted noise signals, wherein the lightning noise signals are induced in the sensor signals in response to a lightning strike on the object.

In accordance with another embodiment of the present technique, a wind turbine is presented. The wind turbine includes a plurality of sensing devices disposed on various components of the wind turbine, and configured to generate sensor signals representative of one or more working state parameters of the wind turbine, a lightning signal processing subsystem configured to combine the sensor signals representative of the one or more working state parameters received from the plurality of sensing devices to generate a composite signal, extract noise signals from the composite signal, and compare the extracted noise signals with one or more lightning signal profiles to determine existence of lightning noise signals in the extracted noise signals, wherein the lightning noise signals are induced in the sensor signals in response to a lightning strike on the wind turbine.

In accordance with still another embodiment of the present technique, a kit for detection of lightning is presented. The kit includes a lightning signal processing subsystem in operational association with a plurality of sensing devices disposed on an object and configured to combine the sensor signals representative of one or more working state parameters of the object received from the plurality of sensing devices to generate a composite signal, extract noise signals from the composite signal, and compare the extracted noise signals with one or more lightning signal profiles to determine the existence of lightning noise signals in the extracted noise signals.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

As will be appreciated, a wind turbine is susceptible to lightning strikes. The lightning strike may damage the wind turbine, and more particularly the wind turbine blades thereby resulting in downtime and repairs. It is therefore desirable to develop a lightning detection system to detect a lightning strike in a timely manner, and hence reduce repairs and downtime of the wind turbine.

Figure 1:
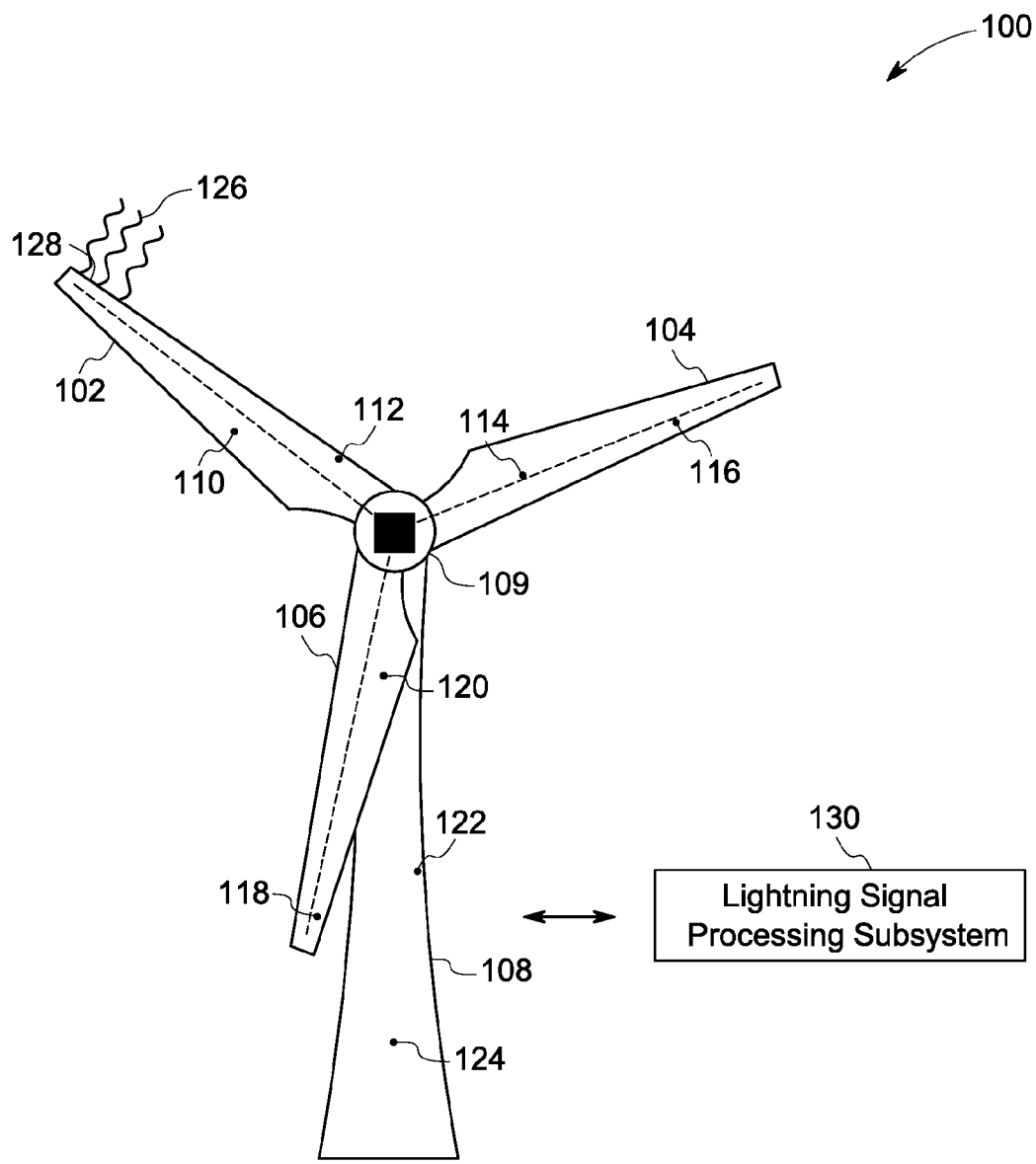
FIG. 1 is a diagrammatical view of a wind turbine including an exemplary lightning detection system, in accordance with aspects of the present technique.

FIG. 1 is a diagrammatical view of a wind turbine 100 including an exemplary lightning detection system, in accordance with aspects of the present technique. As used herein, the term "wind turbine" may be used to refer to a rotating machine that converts kinetic energy of wind to mechanical energy. The mechanical energy may then be converted to electrical energy.

In an exemplary embodiment, the wind turbine 100 includes a tower 108, blades 102, 104 and 106, a nacelle 109 and a hub (not shown in FIG. 1). In a presently contemplated configuration, the blade 102 includes sensing devices 110, 112. Further, the blade 104 may include sensing devices 114, 116, and the blade 106 may include sensing devices 118, 120. Also, in certain embodiments, the tower 108 may include sensing devices 122, 124, as shown in FIG. 1. The sensing devices 110, 112, 114, 116, 118, 120, 122, 124, for example, may include anenometers, voltage sensors, temperature sensors, proximity sensors, tacho rotor sensors, tacho generator sensors, yaw sensors, twisted cable sensors, or combinations thereof. It may be noted that, while in the presently contemplated embodiment, each of the blades 102, 104, 106 and the tower 108 of the wind turbine 100 are each shown as including two sensing devices, in certain embodiments, the number of sensors and positioning of sensors in the wind turbine 100 may vary. It may also be noted that while in the presently contemplated configuration, the nacelle 109 and the hub do not include any sensing devices, in certain embodiments, the nacelle 109 and the hub may also include one or more sensing devices.

Furthermore, in one embodiment, the sensing devices 110, 112, 114, 116, 118, 120, 122, 124 may be configured to generate sensor signals representative of one or more working state parameters of the wind turbine 100. As used herein, the term "working state parameters" may be used to refer to parameters that may be employed to determine a working condition of the wind turbine 100. Additionally, the working state parameters may also include parameters that impact the working condition and an output of the wind turbine 100. The working state parameters, for example, may include wind speed, wind direction, rotations per minute, stress, temperature, generation winding, vibration in blades, vibration in tower, power measurement, twist in power cable of a generator, or combinations thereof.

Moreover, in one embodiment, the sensor signals may include noise signals due to external factors. As used herein, the term "noise signals" may be used to refer to unwanted disturbance in the sensor signals that may distort information carried by sensor signals. The noise signals, for example, may include non-lightning noise signals and lightning noise signals. As used herein, the term "non-lightning noise" may be used to refer to noise signals induced in the sensor signals due to external factors other than a lightning strike. The external factors in a non limiting example may include thermal effects, electromagnetic disturbances, mechanical errors, and the like. As used herein, the term "lightning noise signals" may be used to refer to noise signals induced in the sensor signals due to a lightning strike.

It may be noted that a lightning strike 126 may lead to induction of the lightning noise signals in the sensor signals. The lightning noise signals, for example, may include a lightning strike induced current, a lighting strike induced voltage, a lightning strike induced magnetic field, a lightning strike induced electric field, or combinations thereof.

As illustrated in FIG. 1, the lightning strike 126 strikes the wind turbine 100 at an impact point 128. The lightning strike 126 includes high amplitude current pulses that may lead to the generation of the lightning strike induced current. In one embodiment, the lightning strike induced current may flow from the impact point 128 to ground. The flow of the lightning strike induced current may lead to induction of the lightning noise signals in the sensor signals. Additionally, the flow of the lightning strike induced current may also lead to the generation of the lightning strike induced magnetic field in the wind turbine 100, thereby resulting in the lightning noise signals in the sensor signals.

Moreover, as illustrated in FIG. 1, the wind turbine may be operatively coupled with a lightning signal (LS) processing subsystem 130. In certain embodiments, the lightning signal processing subsystem 130 may be configured to receive the sensor signals from the sensing devices 110, 112, 114, 116, 118, 120, 122, 124. Further, the lightning signal processing subsystem 130 may be configured to process the sensor signals to determine presence or absence of the lightning strike 126. The determination of presence or absence of the lightning strike 126 via processing of the sensor signals generated by the sensing devices 110, 112, 114, 116, 118, 120, 12, 124 will be described in greater detail with reference to FIG. 2.

Furthermore, in certain embodiments, the lightning signal processing subsystem 130 may be further configured to generate a signal indicative of presence or absence of a lightning strike based on the determination of the existence of the lightning noise signals, and communicate the generated signal to a remote location. It may also be noted that in certain other embodiments, the generated signal may be communicated to an onsite location. The generated signal may include an audio signal, a video signal, or both. The video signal may be communicated via a display device, and the audio signal may be communicated via an audio device.

Figure 2:
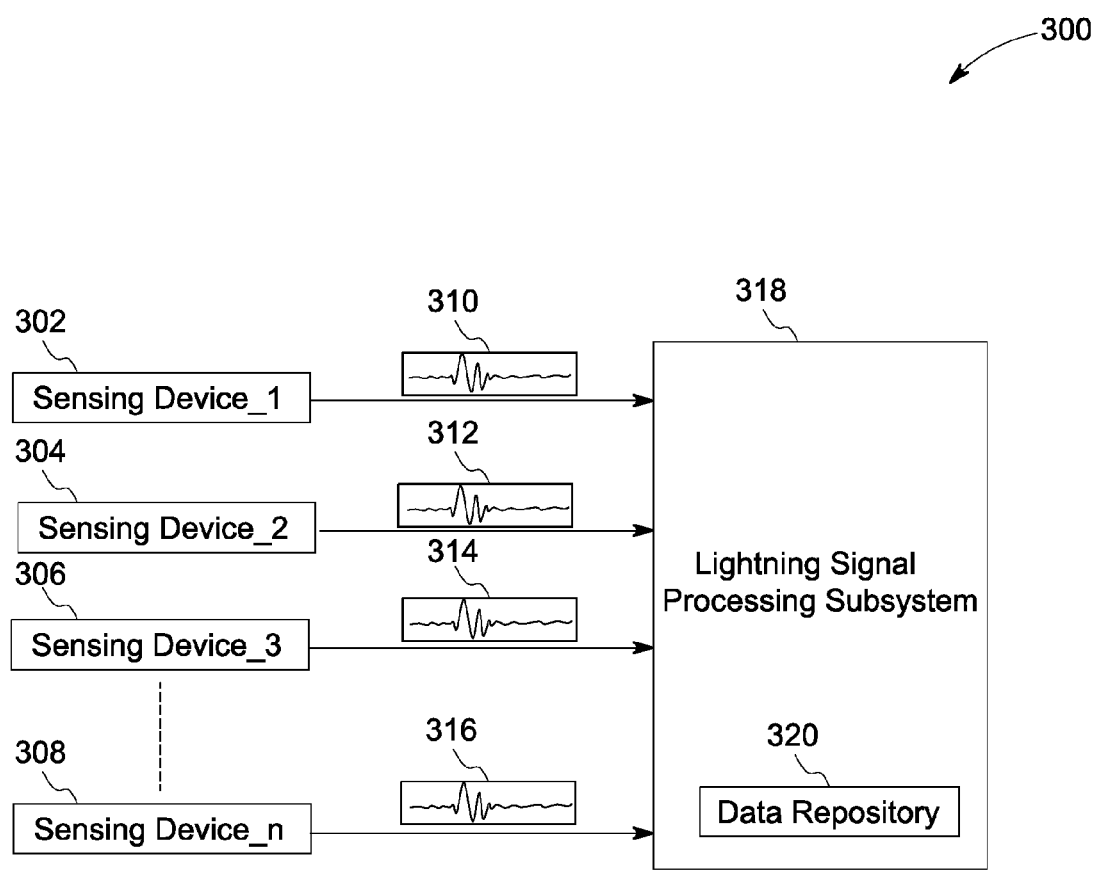
FIG. 2 is a block diagram of an exemplary lightning detection system, in accordance with aspects of the present technique.

In accordance of the present technique, a lightning detection system is presented. FIG. 2 is a block diagram of an exemplary lightning detection system 300, in accordance with aspects of the present technique. In one embodiment, the lightning detection system 300 may be configured to detect a lightning strike on an object. It may be noted that the lightning detection system 300 may be configured to detect lightning strikes on an object, such as, but not limited to, tall buildings, towers, wind turbines, aircrafts, and the like. Although the lightning detection system 300 is described with reference to a wind turbine, such as the wind turbine 100 (see FIG. 1), it will be appreciated that the lightning detection system 300 may also find application in detection of lightning strike in towers, tall buildings, aircrafts, and the like.

In one embodiment, the lightning detection system 300 may include a plurality of sensing devices configured to generate sensor signals representative of the one or more working state parameters of an object. The object, for example may include the wind turbine 100 (see FIG. 1).

In a presently contemplated configuration, the plurality of sensing devices of the lightning detection system 300 includes a first sensing device 302, a second sensing device 304, a third sensing device 306, and an $n^{th}$ sensing device 308. In one embodiment, the sensing devices 302, 304, 306, 308 may be configured to generate sensor signals representative of the one or more working state parameters of the object, as previously noted with respect to the sensing devices 110, 112, 114, 116, 118, 120, 122, 124 (see FIG. 1). The sensing devices 302, 304, 306, 308, for example, may include voltage sensors, temperature sensors, proximity sensors, tacho rotor sensors, tacho generator sensors, yaw sensors, twisted cable sensors, or combinations thereof.

Furthermore, the first sensing device 302 generates a first sensor signal 310, while the second sensing device 304 generates a second sensor signal 312. Similarly, the third sensing device 306 generates a third sensor signal 314, while the $n^{th}$ sensing device 308 generates an $n^{th}$ sensor signal 316. Also, as previously noted, in one embodiment, the sensor signals 302, 304, 306, 308 may include the noise signals due to external factors, where the noise signals may include non-lightning noise signals and lightning noise signals, for example.

Moreover, as shown in FIG. 2, the sensing devices 302, 304, 306, 308 may be operatively coupled to a lightning signal processing subsystem 318. In one embodiment, the sensing devices 302, 304, 306, 308 may be operatively coupled to the lightning signal processing subsystem 318 via a wired connection. In another embodiment, the sensing devices 302, 304, 306, 308 may be operatively coupled to the lightning signal processing subsystem 318 via a wireless connection. Moreover, the lightning signal profiles 318 may be the lightning signal profiles of FIG. 1.

In accordance with exemplary aspects of the present technique, the lightning signal processing subsystem 318 may be configured to receive the sensor signals 310, 312, 314, 316 from the sensing devices 302, 304, 306, 308. Furthermore, the lightning signal processing subsystem 318 may also be configured to combine the sensor signals 310, 312, 314, 316 to generate a composite signal. As used herein, the term "composite signal" may be used to refer to a signal having data corresponding to two or more of the sensor signals 310, 312, 314, 316. In one embodiment, the data, for example, may be representative of the one or more working state parameters of the object. In an exemplary embodiment, the lightning signal processing subsystem 318 may combine the sensor signals 310, 312, 314, 316 by utilizing data fusion methods. Moreover, in a non-limiting example, the data fusion methods may include utilization of correlation functions, neural networks, artificial intelligence, statistical estimation, a Bayesian inference method, a weighted average method, a pattern recognition method, or combinations thereof.

Furthermore, subsequent to the generation of the composite signal, the lightning signal processing subsystem 318 may be configured to extract the noise signals from the composite signal. In one embodiment, the noise signals may be extracted from the composite signal by applying a high pass filter, a Kalman filter algorithm, or the like. Additionally, the lightning signal processing subsystem 318 may be configured to detect existence of any lightning noise signals in the extracted noise signals. More particularly, the lightning signal processing subsystem 318 may be configured to detect the existence of any lightning noise signals in the extracted noise signals by comparing the extracted noise signals with one or more lightning signal profiles. As used herein, the term "lightning signal profile" may be used to refer to a pattern of signals that is representative of a lightning strike. The one or more lightning signal profiles, for example, may include the lightning strike induced current, the lightning strike induced voltage, the lightning strike induced magnetic field, the lightning strike induced electric field, or a combination thereof. If the extracted noise signals are substantially similar to the one or more lightning signal profiles, then the presence of lightning strike is detected. In other words, a match between the extracted noise signal and the one or more lightning signal profiles is indicative of presence of lightning noise signals in the extracted noise signals. As previously noted, the lightning noise signals, for example, may include a lightning strike induced current, a lighting strike induced voltage, a lightning strike induced magnetic field, a lightning strike induced electric field, or combinations thereof. Further, no match between the extracted noise signals and the one or more lightning signal profiles is indicative of the absence of a lightning strike in the extracted noise signals.

In addition, in certain embodiments the lightning signal processing subsystem 318 may be further configured to generate a signal indicative of presence or absence of a lightning strike based on the determination of the existence of the lightning noise signals, and communicate the generated signal to a remote location. It may also be noted that in certain other embodiments, the generated signal may be communicated to an onsite location. The generated signal may include an audio signal, a video signal, or both. The video signal may be communicated via a display device, and the audio signal may be communicated via an audio device.

In one embodiment, a data repository 320 may store one or more lightning signal profiles. As illustrated in the presently contemplated configuration of FIG. 2, the lightning signal processing subsystem 318 may include the data repository 320. Alternatively, the data repository 320 may be a stand-alone subsystem that is in operative association with the lightning signal processing subsystem 318.

Figure 3:
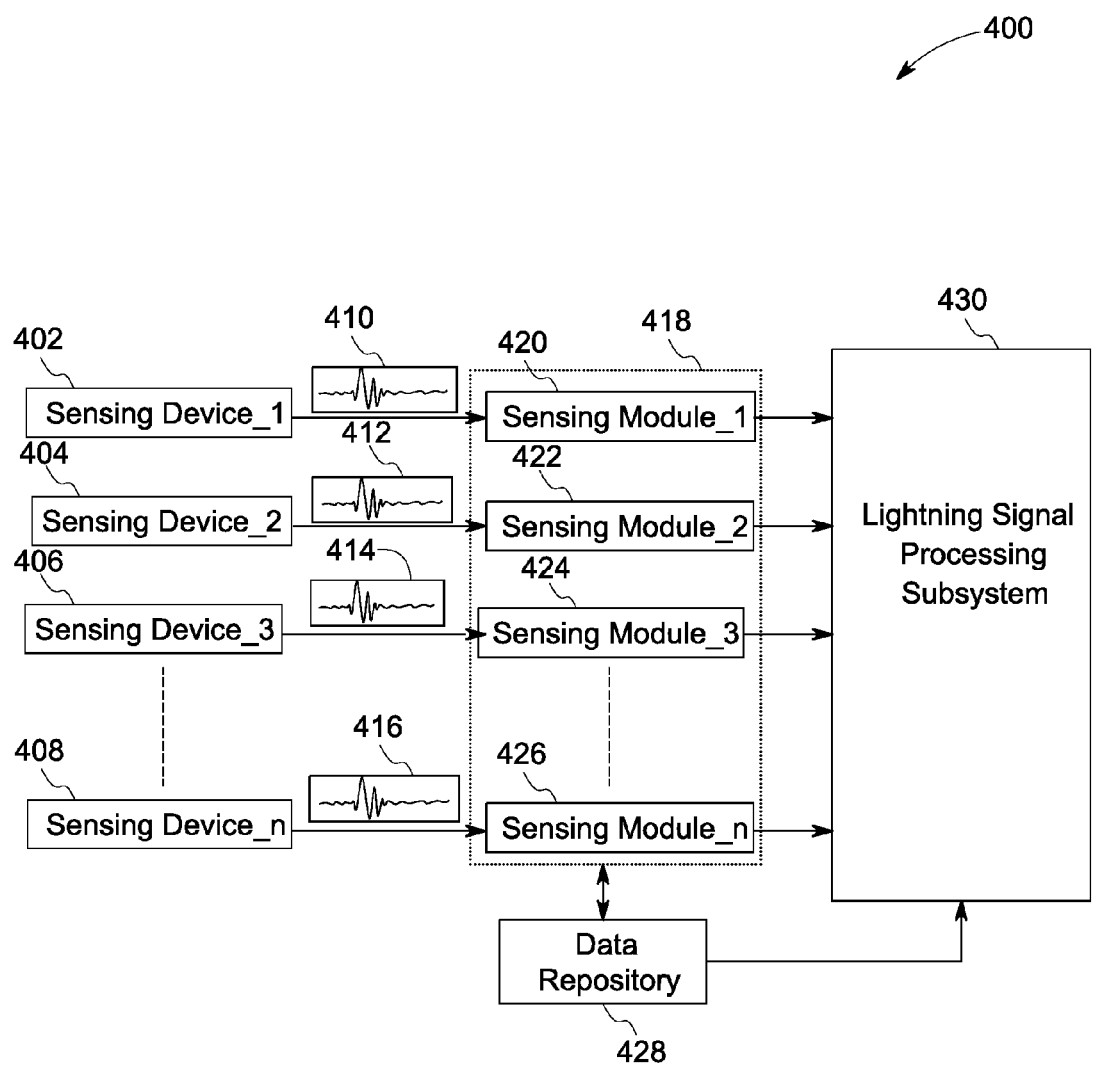
FIG. 3 is a block diagram of another lightning detection system, in accordance with aspects of the present technique.

Referring now to FIG. 3, a block diagram of another embodiment of a lightning detection system 400, in accordance with exemplary aspects of the present technique, is illustrated. The lightning detection system 400 may include a plurality of sensing devices configured to generate sensor signals representative of one or more working state parameters of an object. Further, as previously noted with reference to FIG. 2, the object may include the wind turbine 100 (see FIG. 1). In other embodiments, the object may include tall structures prone to lightning strikes such as tall buildings, towers, aircrafts, and the like.

As illustrated in a presently contemplated configuration of FIG. 3, the lightning detection system 400 includes a first sensing device 402, a second sensing device 404, a third sensing device 406, and an $n^{th}$ sensing device 408. Here again, as previously noted with reference to FIG. 2, the sensing devices 402, 404, 406, 408 may include anenometers, voltage sensors, temperature sensors, proximity sensors, tacho rotor sensors, tacho generator sensors, yaw sensors, twisted cable sensors, or combinations thereof.

Furthermore, the first sensing device 402 generates a sensor signal 410, the second sensing device 404 generates a sensor signal 412, the third sensing device 406 generates a sensor signal 414, and the $n^{th}$ sensing device 408 generates a sensor signal 416. In one embodiment, the sensor signals 410, 412, 414, 416, may also include noise signals, where the noise signals may include the lightning noise signals and the non-lightning noise signals.

Moreover, in one embodiment, the lightning detection system 400 may include a sensing subsystem 418. Furthermore, the sensing subsystem 418 may include one or more sensing modules. In one embodiment, the sensing subsystem 418 may include a first sensing module 420, a second sensing module 422, a third sensing module 424, and an $n^{th}$ sensing module 426. Further, in certain embodiments, the sensing subsystem 418 may be configured to extract noise signals from the sensor signals 410, 412, 414, 416, and compare the extracted noise signals with one or more lightning signal profiles to determine the existence of the lightning noise signals in the extracted noise signals. The sensing modules 420, 422, 424, 426 may retrieve the one or more lightning signal profiles from a data repository 428. The data repository 428 may be in operational communication with the sensing subsystem 418.

Furthermore, each of the sensing modules 420, 422, 424, 426 may be configured to receive a sensor signal generated by the sensing devices 402, 404, 406, 408. More particularly, the first sensor signal 410 is an input to the first sensing module 420, the second sensor signal 412 is an input to the second sensing module 422, the third sensor signal 414 is an input to the third sensing module 424, and the $n^{th}$ sensor signal 416 is an input to the $n^{th}$ sensing module 426.

Additionally, each of the sensing modules 420, 422, 424, 426 may be configured to extract noise signals, if any, from a corresponding sensor signal. More particularly, the first sensing module 420 may be configured to extract the noise signals from the first sensor signal 410, while the second sensing module 422 may be configured to extract the noise signals from the second sensor signal 412. Similarly, the third sensing module 424 may be configured to extract the noise signals from the third sensor signal 414, while the $n^{th}$ sensing module 426 may be configured to extract the noise signals from the $n^{th}$ sensor signal 416.

Moreover, the sensing modules 420, 422, 424, 426 may be further configured to compare a corresponding extracted noise signal with the one or more lightning signal profiles to determine the existence of the lightning noise signals in the extracted noise signals. More particularly, the first sensing module 420 may be configured to compare the noise signals extracted from the first sensor signal 410 with the one or more lightning signal profiles, while the second sensing module 422 may be configured to compare the noise signals extracted from the second sensor signal 412 with the one or more lightning signal profiles. Similarly, the third sensing module 424 may be configured to compare the noise signals extracted from the third sensor signal 414 with the one or more lightning signal profiles, while the $n^{th}$ sensing module 426 may be configured to compare the noise signals extracted from the $n^{th}$ sensor signal 416 with the one or more lightning signal profiles.

While in the presently contemplated configuration each of the sensing modules 420, 422, 424, 426 is shown as receiving a single sensor signal generated by the sensing devices 402, 404, 406, 408, in accordance with exemplary aspects of the present technique, each of the sensing modules 420, 422, 424, 426 may also receive multiple sensor signals generated by the sensing devices 402, 404, 406, 408.

Additionally, in one embodiment, the lightning detection system 400 may also include a lightning signal processing subsystem 430. In the embodiment shown in FIG. 3, the lightning signal processing subsystem 430 is shown as being in operational communication with the one or more sensing modules 420, 422, 424, 426. In still another embodiment, the lightning signal processing subsystem 430 may be operatively associated with the sensing subsystem 418.

In accordance with the present technique, the lightning signal processing subsystem 430 may be configured to generate a composite noise signal. In one embodiment, the lightning signal processing subsystem 430 may generate the composite noise signal by combining the extracted noise signals received from the sensing modules 420, 422, 424, 426. As previously noted, the sensing modules 420, 422, 424, 426 may be configured to extract the noise signals from a corresponding sensor signal, and also compare the corresponding extracted noise signals with the one or more lightning signal profiles to determine presence of any lightning noise signals in the extracted noise signals. Subsequent to the comparison of the extracted noise signals with the one or more lightning signal profiles, if it is determined that at least one of the extracted noise signals is substantially similar to the one or more lightning signal profiles, then the extracted noise signals may be combined by the lightning signal processing subsystem 430 to generate a composite noise signal. As used herein, the term "composite noise signal" may be used to refer to a signal having data representative of one or more lightning strikes on the object. More particularly, the term "composite noise signal" may be used to refer to a signal that includes the lightning noise signals received by one or more of the sensing devices 402, 404, 406, 408. In one embodiment, the composite noise signal may include a lightning strike induced current, a lighting strike induced voltage, a lightning strike induced magnetic field, a lightning strike induced electric field, or combinations thereof.

Furthermore, in accordance with exemplary aspects of the invention, the lightning signal processing subsystem 430 may be configured to combine the extracted noise signals to generate the composite noise signal if lightning noise signals exist in one or more of the extracted noise signals. More particularly, the lightning signal processing subsystem 430 may combine the noise signals by using data fusion methods. The data fusion methods, for example, may include utilization of correlation functions, neural networks, artificial intelligence, statistical estimation, a Bayesian inference method, a weighted average method, a pattern recognition method, or combinations thereof.

Additionally, the lightning signal processing subsystem 430 may be configured to determine the presence or absence of a lightning strike. More particularly, the lightning signal processing subsystem 430 may determine the presence or absence of the lightning strike by comparing the composite noise signal with the one or more lightning signal profiles.

The determination of the presence or absence of the lightning strike will be described in greater detail with reference to FIG. 5.

Furthermore, in certain embodiments the lightning signal processing subsystem 430 may be further configured to generate a signal indicative of presence or absence of a lightning strike based on the determination of the existence of the lightning noise signals, and communicate the generated signal to a remote location. It may also be noted that in certain other embodiments, the generated signal may be communicated to an onsite location. The generated signal may include an audio signal, a video signal, or both. The video signal may be communicated via a display device, and the audio signal may be communicated via an audio device.

Figure 4:
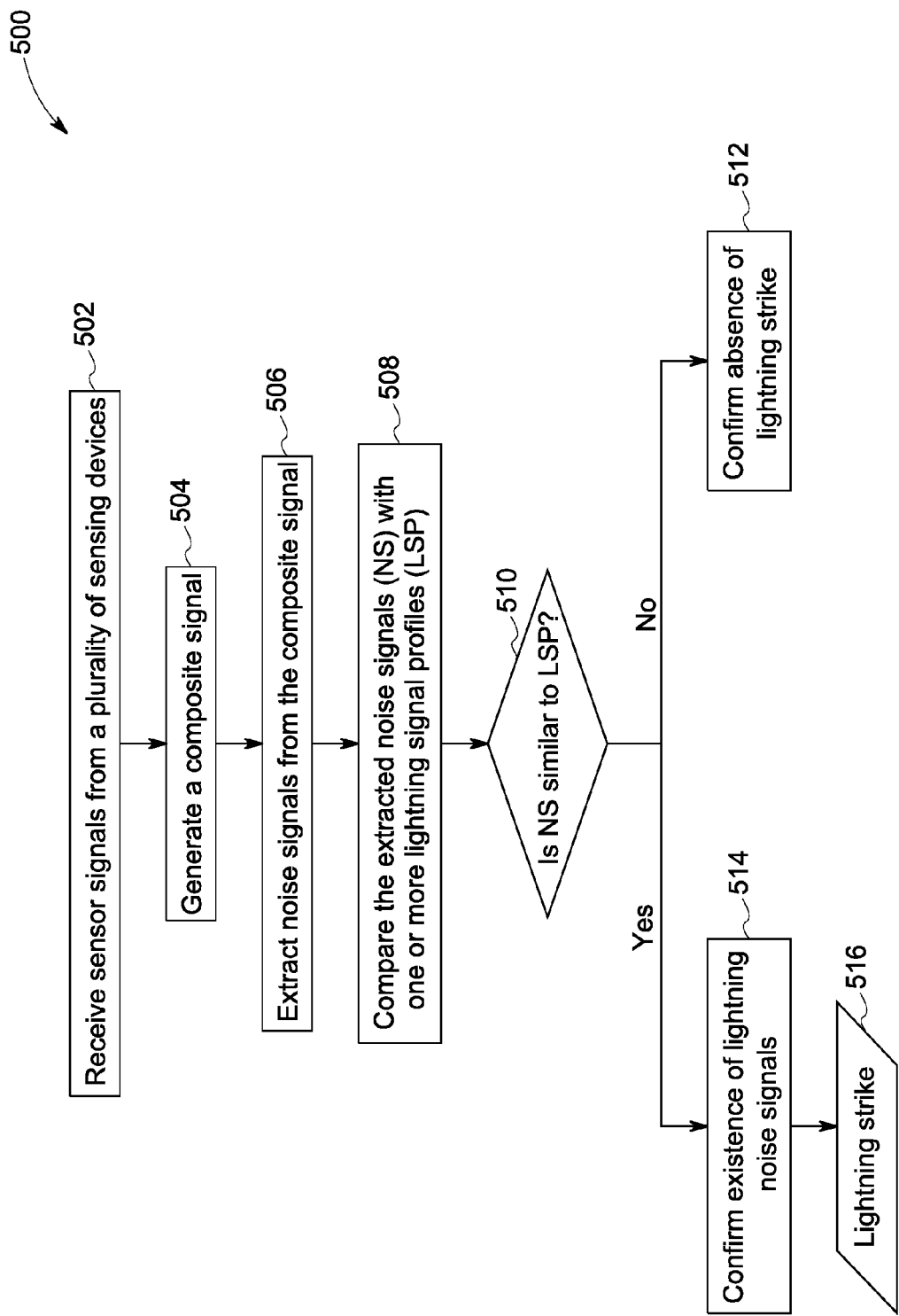
FIG. 4 is a flow chart illustrating an exemplary lightning detection method, in accordance with aspects of the present technique.

Turning now to FIG. 4, a flow chart 500 illustrating an exemplary lightning detection method, in accordance with aspects of the present technique, is depicted. The method starts at step 502, where a plurality of sensor signals may be received. In one embodiment, the plurality of sensor signals may be received from one or more sensing devices. In certain embodiments, the one or more sensing devices may be disposed on the blades of a wind turbine, a nacelle, a hub, a tower of the wind turbine, or combinations thereof. The plurality of sensor signals, for example, may include the sensor signals 310, 312, 314, 316 (see FIG. 2). As previously noted with reference to FIGS. 1-3, the plurality of sensor signals may be representative of one or more working state parameters of an object, such as the wind turbine 100 (see FIG. 1). In one embodiment, the plurality of sensor signals may also include noise signals where the noise signals may include non-lightning noise signals and lightning noise signals.

Subsequent to the receipt of the plurality of sensor signals, a composite signal may be generated at step 504. As previously noted with reference to FIG. 2, the composite signal may be representative of a signal having data corresponding to two or more of the plurality of sensor signals. In one embodiment, the lightning signal processing subsystem 318 (see FIG. 2) may be configured to generate the composite signal. The composite signal, for example, may be generated by combining two or more of the plurality of sensor signals. In one embodiment, the two or more of the plurality of sensor signals may be combined by utilizing data fusion methods. As previously noted, the data fusion methods, for example, may include utilization of correlation functions, neural networks, artificial intelligence, statistical estimation, a Bayesian inference method, a weighted average method, a pattern recognition method, or combinations thereof.

Furthermore, at step 506, noise signals may be extracted from the composite signal. As previously noted, the lightning signal processing subsystem 318 (see FIG. 2) may be configured to extract the noise signals from the composite signal. At step 508, the extracted noise signals (NS) may be compared with one or more lightning signal profiles (LSP). Further, as previously noted with reference to FIG. 2, the lightning signal processing system 318 may retrieve the one or more lightning signal profiles from the data repository 320 (see FIG. 2). Further, the lightning signal processing subsystem 318 may be configured to compare the extracted noise signals with the one or more lightning signal profiles. Subsequently, at step 510, a check may be carried out to determine if the extracted noise signals match the one or more lightning signal profiles. Accordingly, at step 510, if it is determined that the extracted noise signals substantially match the one or more lightning signal profiles, then the existence of the lightning noise signals may be confirmed, as indicated by step 514. In accordance with exemplary aspects of the present technique, the existence of the lightning noise signals may be indicative of the occurrence of a lightning strike 516. However, at step 510, if it is determined that the noise signals do not match the one or more lightning signal profiles, then the absence of a lightning strike may be confirmed as depicted by step 512.

Furthermore, in certain embodiments the lightning detection method may generate a signal indicative of the presence or absence of a lightning strike based on the determination of the existence of the lightning noise signals, and communicate the generated signal to a remote location. The generated signal may also be communicated to an onsite location. As previously noted, the generated signal may include an audio signal, a video signal, or both. The video signal may be communicated via a display device, and the audio signal may be communicated via an audio device.

Figure 5:
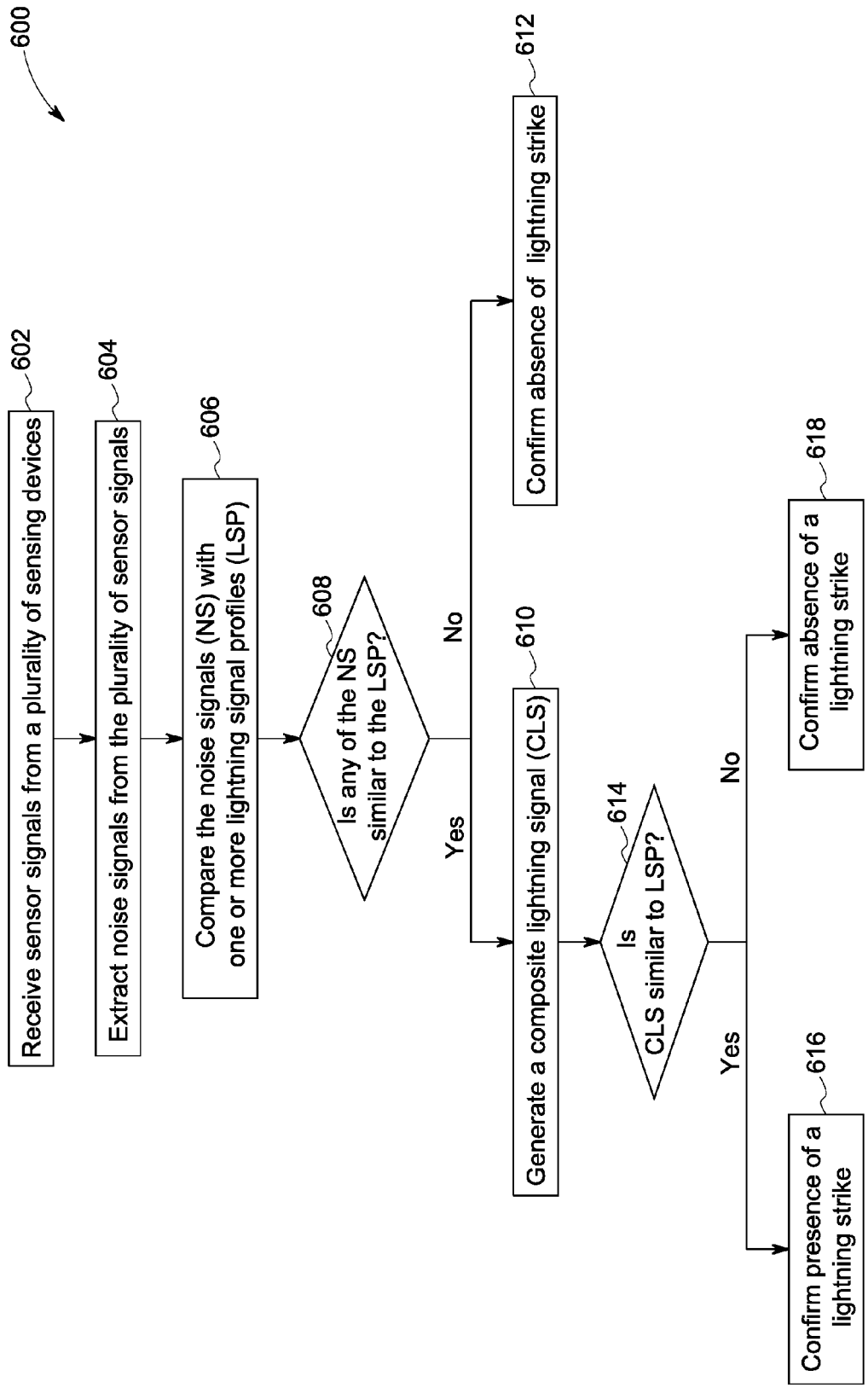
FIG. 5 is a flow chart illustrating another lightning detection method, in accordance with aspects of the present technique.

Referring now to FIG. 5, a flow chart 600 illustrating another lightning detection method, in accordance with aspects of the present technique, is depicted. The method starts at step 602, where a plurality of sensor signals may be received. More particularly, in one embodiment, the plurality of sensor signals may be received from one or more sensing devices. As previously noted with respect to FIG. 4, the one or more sensing devices may be disposed on the blades, the nacelle, the hub, the tower of the wind turbine, or combinations thereof. In addition as previously noted with reference to FIG. 1, the plurality of sensor signals may be representative of working state parameters of an object, such as the wind turbine. In one embodiment, the plurality of sensor signals may also include noise signals, where the noise signals may include the non-lightning noise signals and lightning noise signals.

Subsequently at step 604, the noise signals may be extracted from the plurality of sensor signals. In certain embodiments, the noise signals may be extracted by one or more sensing modules. Furthermore, at step 606, the extracted noise signals may be compared with one or more lightning signal profiles. In one embodiment, extracted noise signals may be compared with the one or more lightning signal profiles by the one or more sensing modules. The one or more sensing modules, for example, may include the sensing modules 420, 422, 424, 426 (see FIG. 3). Also, as previously noted with reference to FIG. 3, the data repository 430 (see FIG. 3) may store the one or more lightning signal profiles. Consequent to the comparison of the noise signals with the one or more lightning signal profiles, substantial similarity or dissimilarity between the noise signals and the one or more lightning signal profiles may be determined at step 608.

In one embodiment, at step 608, if any of the extracted noise signals are found to be substantially similar to the one or more lightning signal profiles, then all the extracted noise signals may be combined to generate a composite noise signal, as depicted by step 610. As previously noted, the lightning signal processing subsystem 430 may generate the composite noise signal. Furthermore, as depicted by step 614, if the composite noise signal may be compared with the one or more lightning signal profiles. If at step 614, it is determined that the composite noise signal is substantially similar to the one or more lightning signal profiles, then presence of a lightning strike may be confirmed as depicted by step 616. However, at step 614, if the composite noise signal does not match the one or more lightning signal profiles, then the absence of a lightning strike may be confirmed, as indicated at step 618. With returning reference to step 608, none of the noise signals match the one or more lightning signal profiles, then the absence of a lightning strike is confirmed as indicated by step 612.

The lightning detection systems and methods as described herein above may also be used to retrofit a wind turbine, such as the wind turbine 100 of FIG. 1 to facilitate detection of a lightning strike on the wind turbine. More particularly, the exemplary lightning signal processing subsystem may be retrofit to the existing infrastructure of the wind turbine, including the tower, the blades, the nacelle and the hub, the sensing devices disposed on various components of the wind turbine to facilitate the detection of any lightning strikes on the wind turbine. Furthermore, in certain embodiments, the lightning detection systems and methods may generate a signal indicative of presence or absence of a lightning strike based on the determination of the existence of the lightning noise signals, and communicate the generated signal to a remote location, an onsite location, or both, thereby detecting a lightning strike in a timely manner and hence reducing repairs and downtime of the wind turbine.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A lightning detection system, comprising:
a plurality of sensing devices configured to generate non-acoustic sensor signals representative of one or more working state parameters of an object;
a lightning signal processing subsystem configured to:
combine the sensor signals representative of the one or more working state parameters received from the plurality of sensing devices to generate a composite signal;
extract noise signals from the composite signal;
compare the extracted noise signals with one or more lightning signal profiles to determine the existence of lightning noise signals in the extracted noise signals; and
generate an output indicative of a lightning detection event, the detection based on the comparison;
wherein the object comprises a wind turbine, a tower, or an aircraft; and
wherein the one or more working state parameters of the object comprise wind speed, wind direction, rotations per minute, stress, temperature, generation winding, vibration in blades, vibration in tower, power measurement, twist in power cable of a generator, or combinations thereof.

2. The system of claim 1, wherein the lightning noise signals are induced in the sensor signals in response to a lightning strike on the object.

3. The system of claim 2, wherein the lightning noise signals comprise a lightning strike induced current, a lighting strike induced voltage, a lightning strike induced magnetic field, a lightning strike induced electric field, or combinations thereof.

4. The system of claim 1, wherein the one or more lightning signal profiles comprise a lightning strike induced current, a lighting strike induced voltage, a lightning strike induced magnetic field, a lightning strike induced electric field, or combinations thereof.

5. The system of claim 1, wherein the lightning signal processing subsystem combines the sensor signals representative of the one or more working state parameters by utilizing data fusion methods.

6. The system of claim 5, wherein the data fusion methods comprise utilization of correlation functions, neural networks, artificial intelligence, statistical estimation, a Bayesian inference method, a weighted average method, a pattern recognition method, or combinations thereof.

7. The system of claim 1, wherein the plurality of sensing devices comprises anemometers, voltage sensors, temperature sensors, proximity sensors, tacho rotor sensors, tacho generator sensors, yaw sensors, twisted cable sensors, or combinations thereof.

8. The system of claim 1, further comprising a data repository to store the one or more lightning signal profiles.

9. The system of claim 1, further configured to:
generate a signal indicative of presence or absence of a lightning strike based on the determination of the existence of the lightning noise signals; and
communicate the generated signal to a remote location, an onsite location, or both.

10. A lightning detection system, comprising:
a plurality of sensing devices configured to generate a plurality of sensor signals representative of one or more working state parameters of an object;
a sensing subsystem comprising one or more sensing modules and configured to:
extract a plurality of noise signals from the plurality of sensor signals representative of the one or more working state parameters of the object received from the plurality of sensing devices;
compare the extracted plurality of noise signals with one or more lightning signal profiles to determine existence of one or more lightning noise signals in the extracted plurality of noise signals; and
a lightning signal processing subsystem in operative communication with the sensing subsystem and configured to combine the extracted plurality of noise signals received from the sensing subsystem to generate a composite noise signal based on a first determination of the existence of one or more lightning noise signals in the plurality of extracted noise signals;
wherein an output indicative of the presence of a lightning strike is generated based on a second determination made using the composite noise signal; and
wherein the lightning noise signals are induced in the sensor signals in response to a lightning strike on the object.

11. The system of claim 10, wherein the one or more lightning signal profiles comprise lightning strike induced current, a lighting strike induced voltage, a lightning strike induced magnetic field, a lightning strike induced electric field, or combinations thereof.

12. The system of claim 10, wherein the composite noise signal comprises a lightning strike induced current, a lighting strike induced voltage, a lightning strike induced magnetic field, a lightning strike induced electric field, or combinations thereof.

13. The system of claim 10, wherein the lightning signal processing subsystem is configured to combine the plurality of extracted noise signals by utilizing correlation functions, neural network, a Bayesian inference method, a weighted average method, artificial intelligence, a pattern recognition, a statistical estimation, or combinations thereof.

14. The system of claim 10, wherein the lightning signal processing subsystem is further configured to compare the composite noise signal with the one or more lightning signal profiles to make the second determination.

15. The system of claim 10, wherein the plurality of sensing devices comprises, anemometers, voltage sensors, temperature sensors, proximity sensors, tacho rotor sensors, tacho generator sensors, yaw sensors, twisted cable sensors, or combinations thereof.

16. A lightning detection method, comprising:
combining one or more sensor non-acoustic signals representative of one or more working state parameters to generate a composite signal, wherein the one or more sensor signals are received from plurality of sensing devices disposed on an object;
extracting noise signals from the composite signal via use of a lightning signal processing subsystem;
comparing the extracted noise signals with one or more lightning signal profiles to determine existence of lightning noise signals in the extracted noise signals via use of the lightning signal processing subsystem; and
generating an output indicative of a lightning detection event, the detection based on the comparison;
wherein a lightning strike on the object induces the lightning noise signals in the sensor signals representative of the one or more working state parameters;
wherein the object comprises a wind turbine, a tower, or an aircraft; and
wherein the one or more working state parameters of the object comprise wind speed, wind direction, rotations per minute, stress, temperature, generation winding, vibration in blades, vibration in tower, power measurement, twist in power cable of a generator, or combinations thereof.

17. A lightning detection method, comprising:
extracting a plurality of noise signals from a plurality of sensor signals representative of one or more working state parameters of an object, wherein the plurality of sensor signals are received from a plurality of sensors disposed on the object;
comparing the plurality of extracted noise signals with one or more lightning signal profiles to determine existence of one or more lightning noise signals in the plurality of extracted noise signals; and
combining the plurality of extracted noise signals to generate a composite noise signal based on a first determination of the existence of one or more lightning noise signals in the plurality of extracted noise signals;
wherein an output indicative of the presence of a lightning strike is generated based on a second determination made using the composite noise signal; and
wherein a lightning strike on the object induces the lightning noise signals in the sensor signals representative of the one or more working state parameters.

18. The method of claim 17, the second determination further comprising comparing the composite noise signal with the one or more lightning signal profiles.

19. A wind turbine, comprising:
a plurality of non-acoustic sensing devices disposed on various components of the wind turbine, and configured to generate sensor signals representative of one or more working state parameters of the wind turbine;
a lightning signal processing subsystem configured to:
combine the sensor signals representative of the one or more working state parameters received from the plurality of sensing devices to generate a composite signal;
extract noise signals from the composite signal;
compare the extracted noise signals with one or more lightning signal profiles to determine existence of lightning noise signals in the extracted noise signals; and
generate an output indicative of a lightning detection event, the detection based on the comparison;
wherein the lightning noise signals are induced in the sensor signals in response to a lightning strike on the wind turbine; and
wherein the one or more working state parameters of the object comprise wind speed, wind direction, rotations per minute, stress, temperature, generation winding, vibration in blades, vibration in tower, power measurement, twist in power cable of a generator, or combinations thereof.

20. A kit for detection of lightning, the kit comprising:
a lightning signal processing subsystem in operational association with a plurality of sensing devices disposed on an object and configured to:
combine sensor signals representative of one or more working state parameters of the object received from the plurality of sensing devices to generate a composite signal; and
extract noise signals from the composite signal; and
compare the extracted noise signals with one or more lightning signal profiles to determine the existence of lightning noise signals in the extracted noise signals; and
generate an output indicative of a lightning detection event, the detection based on the comparison;
wherein the object comprises a wind turbine, a tower, or an aircraft; and
wherein the one or more working state parameters of the object comprise wind speed, wind direction, rotations per minute, stress, temperature, generation winding, vibration in blades, vibration in tower, power measurement, twist in power cable of a generator, or combinations thereof.

21. The kit of claim 20, further configured to:
generate a signal indicative of presence or absence of a lightning strike based on the determination of the existence of the lightning noise signals; and
communicate the generated signal to a remote location, an onsite location, or both.

* * * * *